US010842061B2

(12) United States Patent
Teraoka et al.

(10) Patent No.: US 10,842,061 B2
(45) Date of Patent: Nov. 17, 2020

(54) SOLDERING APPARATUS

(71) Applicant: Hakko Corporation, Osaka (JP)

(72) Inventors: Yoshitomo Teraoka, Osaka (JP);
Satoshi Manda, Osaka (JP)

(73) Assignee: HAKKO CORPORATION, Osaka (JP)

( * ) Notice: Subject to any disclaimer, the term of this patent is extended or adjusted under 35 U.S.C. 154(b) by 243 days.

(21) Appl. No.: 16/148,773

(22) Filed: Oct. 1, 2018

(65) Prior Publication Data

US 2019/0104659 A1  Apr. 4, 2019

Related U.S. Application Data

(60) Provisional application No. 62/566,653, filed on Oct. 2, 2017.

(51) Int. Cl.
*B23K 1/00* (2006.01)
*H05K 13/08* (2006.01)
(Continued)

(52) U.S. Cl.
CPC ........ *H05K 13/0895* (2018.08); *B23K 1/0016* (2013.01); *B23K 3/033* (2013.01);
(Continued)

(58) Field of Classification Search
CPC ........ B23K 3/08; B23K 1/0016; B23K 3/033; B23K 2101/42; B23K 3/02; B23K 3/027; B23K 3/087; B23K 3/025; B23K 3/063; B23K 37/0408; B23K 3/03; B23K 3/0323; B23K 3/0369; B23K 3/0607; B23K 1/018; B23K 1/20; B23K 2103/12; B23K 35/3006; B23K 3/0338; B23K 3/0346; B23K 3/0471; B23K 11/252; B23K 1/012; B23K 23/00; B23K 37/0205; B23K 37/0235;
(Continued)

(56) References Cited

U.S. PATENT DOCUMENTS

2007/0031916 A1 * 2/2007 Ponce .................... C12M 47/06
435/34

FOREIGN PATENT DOCUMENTS

JP  2000-301328 A  10/2000
JP  2011-20172 A   2/2011
JP  2016-124004 A  7/2016

* cited by examiner

*Primary Examiner* — Erin B Saad
(74) *Attorney, Agent, or Firm* — Squire Patton Boggs (US) LLP

(57) ABSTRACT

A soldering apparatus comprises a soldering mechanism and a management unit. The management unit converts operation history of the soldering mechanism into a numerical value, compares the numerical value to a predetermined threshold value, and generates a notifying signal if the numerical value exceeds the predetermined threshold value. The notifying signal may result in cessation of operation of the soldering mechanism. The notifying signal may result in a visual and/or audio reminder to the operator to inspect or replace a part of the soldering mechanism. With the management unit, the operator need not guess or rely on personal experience to determine when to perform an inspection or replacement. Reliance on personal experience can be error prone and lead to inefficiency. The management unit may reduce the possibility of soldering with a degraded soldering tip or other part, which may have an adverse effect on soldering quality.

10 Claims, 8 Drawing Sheets

(51) Int. Cl.
*B23K 3/03* (2006.01)
*H05K 13/04* (2006.01)
*B23K 3/06* (2006.01)
*B23K 101/42* (2006.01)

(52) U.S. Cl.
CPC ....... *B23K 3/0607* (2013.01); *H05K 13/0465* (2013.01); *B23K 2101/42* (2018.08)

(58) Field of Classification Search
CPC .. B23K 37/0443; B23K 3/029; B23K 3/0478; B23K 3/0646; B23K 1/16; B23K 1/19; B23K 2101/36; B23K 3/0315; B23K 3/04; B23K 3/0615
See application file for complete search history.

SOLDERING APPARATUS

CROSS-REFERENCE TO RELATED APPLICATIONS

This application claims the benefit of Provisional Application No. 62/566,653, filed Oct. 2, 2017, which is incorporated herein by reference. This application claims the benefit of Japanese Application No. 2017-230710, filed Oct. 2, 2017, which is incorporated herein by reference.

TECHNICAL FIELD

The present invention relates to a soldering apparatus for automatically soldering at a predetermined soldering position and notifying the history of soldering operations.

BACKGROUND

Various soldering apparatuses have been developed to automatically execute soldering at a predetermined soldering position (c.f. JP 2000-75912 A). According to JP 2000-75912 A, an operator inputs coordinate values of soldering positions to a personal computer. The soldering apparatus may then automatically perform soldering at the input soldering positions.

SUMMARY

Briefly and in general terms, the present invention is directed to a soldering apparatus.

In certain aspects, a soldering apparatus comprises a soldering mechanism and a management unit. The soldering mechanism is configured to move a soldering iron to a soldering position on an electronic board and is configured to supply solder to the soldering iron at the soldering position. The management unit is configured to manage operation history of the soldering mechanism. The management unit comprises a quantifying portion that converts the operation history of the soldering mechanism into a numerical value and that compares the numerical value to a predetermined threshold value. The management unit comprises a notifying signal generator that generates a notifying signal in response to a determination by the quantifying portion that the numerical value exceeds the predetermined threshold value.

In aspects, the notifying signal may result in cessation of operation of the soldering mechanism. The notifying signal may result in a visual and/or audio reminder to the operator to inspect or replace a part of the soldering mechanism.

In aspects, the user does not need try to estimate or keep track of how much the soldering apparatus is used in order to determine an appropriate time to conduct inspection and/or maintenance of the soldering mechanism. The user need not count the number of work pieces that have been worked on, count the number of individual soldering operations that have been performed, and/or guess how much solder has been used.

The features and advantages of the invention will be more readily understood from the following detailed description which should be read in conjunction with the accompanying drawings.

DETAILED DESCRIPTION

Figure 6:
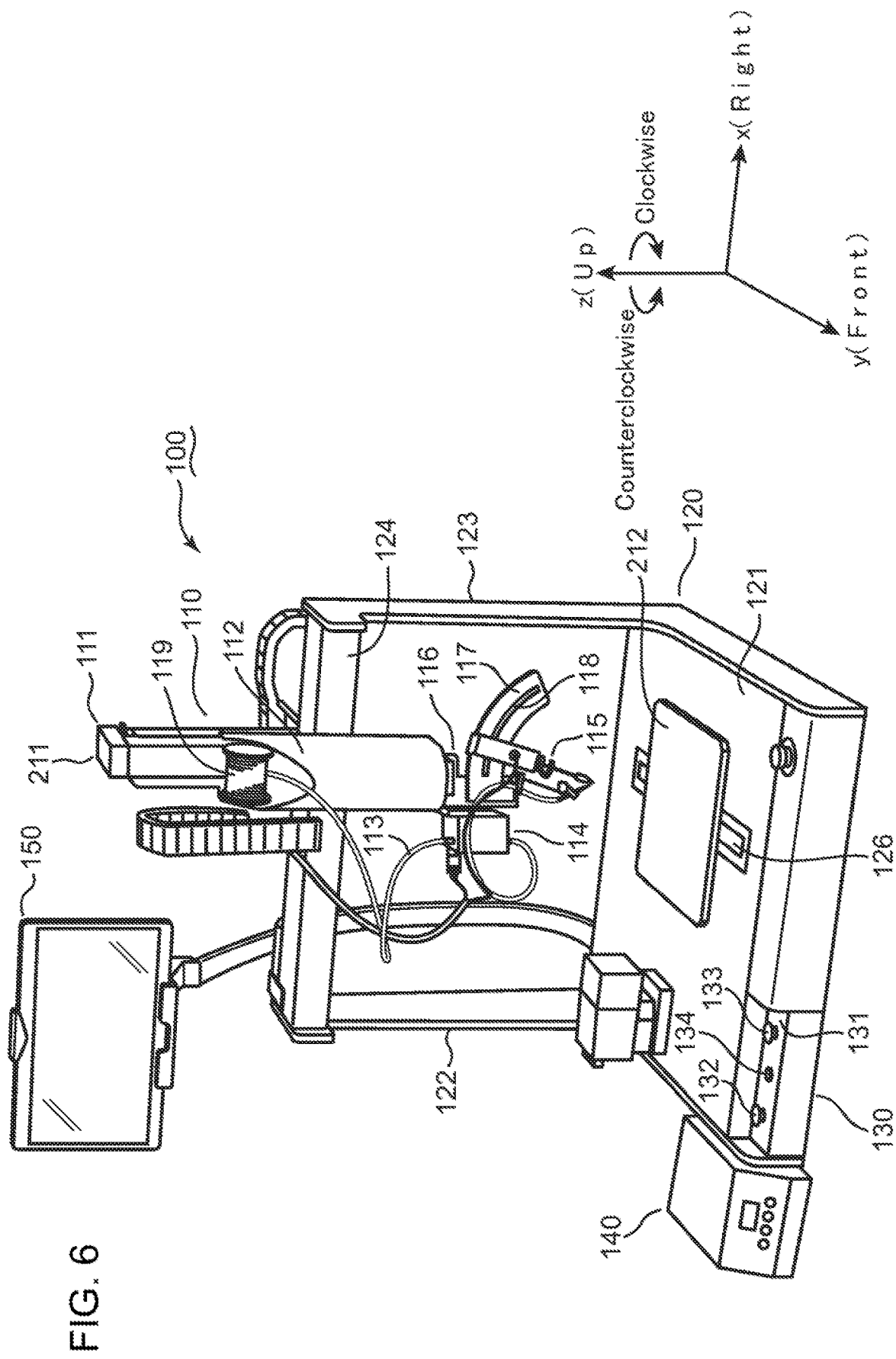
FIG. 6 is a schematic perspective view of the example soldering apparatus.

FIG. 6 shows example soldering apparatus 100 and x, y, z-axes. In the following description, a positive direction of the x-axis is defined as "right". A negative direction of the x-axis is defined as "left". A positive direction of the y-axis is defined as "front". A negative direction of the y-axis is defined as "rear". A positive direction of the z-axis is defined as "up". A negative direction of the z-axis is defined as "down". Terms "clockwise" and "counterclockwise" refer to rotation about a rotation axis parallel to the z-axis. These directional terms are used for clarity of explanation only. Therefore, a principle of the present embodiment is not limited by these directional terms.

The soldering apparatus 100 includes a soldering mechanism 110, a support 120, an operation unit 130, a temperature controller 140 and an input interface 150. The soldering mechanism 110 includes a thread solder 113 and a soldering iron 115. The soldering mechanism 110 includes the function to adjust a relative positional relationship between the iron tip of the soldering iron 115 and the electric board and the function to feed the thread solder 113 to the iron tip. The iron tip is what melts the solder and can be made of any metal suitable for melting solder. The aforementioned temperature controller 140 is responsible for controlling a temperature of the iron tip of the soldering iron 115. The support 120 supports the soldering mechanism 110, the operation unit 130 and input interface 150. The temperature controller 140 is next to the support 120. The operation unit 130 can be used for a teaching operation in which a desired soldering operation is or sequence of soldering operations are programmed into the apparatus 100 so that the soldering operation(s) can be performed automatically later. During the teaching operation, the user operates the operation unit 130, which causes the soldering mechanism 110 adjust the positional relationship between the soldering iron 115 and the electric board depending on the operation of the operation unit 130. When the iron tip of the soldering iron 115 reaches the soldering position on the electric board, the operator operates the operation unit 130 in such a way that soldering positions are stored in the soldering mechanism 110. After teaching, the soldering mechanism 110 moves the iron tip of the soldering iron 115 to the stored soldering position automatically and solders at the stored soldering position. The input interface 150 is used by an operator (human user) to input various operation parameters.

The soldering mechanism 110 includes the thread solder 113, the soldering iron 115, a solder feeder 114, a support mechanism 211, an installation table 212 and a driving portion 213. The solder feeder 114 feeds the thread solder 113 to the soldering iron 115. The support mechanism 211 supports the thread solder 113, the solder feeder 114, and the soldering iron 115. The support mechanism 211 is attached to the support 120. The operator (a human user) can set an electronic board (not shown) on the installation table 212. The driving portion 213 includes plural driving motors to move the support mechanism 211 and a driving motor to move the installation table 212. The plural driving motors for the support mechanism 211 move the soldering iron 115 along the X and Y axes and rotates the soldering iron 115 by an angle θ as measured on the X-Y plane. The driving motor for the installation table 212 causes a change in relative positions of the soldering iron and the electronic board along the y-axis.

The support mechanism 211 includes a horizontally movable column 111, a vertically movable column 112 and a holding portion 116. The horizontally movable column 111 holds the vertically movable column 112, the thread solder 113, the solder feeder 114, the soldering iron 115 and the holding portion 116, and moves in the x-axis direction under an operation of the driving portion 213. The vertically movable column 112 holds the thread solder 113, the solder feeder 114, the soldering iron 115 and the holding portion 116, and moves in the z-axis direction under an operation of the driving portion 213. The holding portion 116 holds the solder feeder 114 and the soldering iron 115, and makes these go around a rotation axis substantially coincident with a vertical central axis of the vertically movable column 112.

The horizontally movable column 111 is a columnar member elongated in the z-axis direction. The horizontally movable column 111, the support 120 and the driving portion 213 are designed so that the horizontally movable column 111 moves in the x-axis direction when one of the motors forming the driving portion is operated. Various structures known in the art may be applied to a design of the horizontally movable column 111, the support 120 and the driving portion 213. The present embodiment is not limited to a specific coupling structure among the horizontally movable column 111, the support 120 and the driving portion 213.

Like the horizontally movable column 111, the vertically movable column 112 is a columnar member elongated in the z-axis direction. The vertically movable column 112 is attached to the horizontally movable column 111. The vertically movable column 112, the horizontally movable column 111 and the driving portion 213 are designed so that the vertically movable column 112 moves substantially vertically along the horizontally movable column 111 when one of the motors forming the driving portion 213 is operated. Various coupling structures known in the art may be applied to a design of the vertically movable column 112, the horizontally movable column 111 and the driving portion 213. The present embodiment is not limited to a specific coupling structure among the vertically movable column 112, the horizontally movable column 111 and the driving portion 213.

The holding portion 116 is used for holding the solder feeder 114 and the soldering iron 115. The holding portion 116 is connected to a lower end of the vertically movable column 112. Therefore, the holding portion 116, the solder feeder 114 and the soldering iron 115 may move upward, downward, leftward and rightward together with the vertically movable column 112. The holding portion 116, the vertically movable column 112 and the driving portion are designed so that the holding portion 116 rotates around the rotation axis substantially coincident with the vertical central axis of the vertically movable column 112 when one of the motors forming the driving portion is operated. By operating the operation unit 130 to rotate the holding portion 116, the operator may prevent the soldering iron 115 from colliding with an electronic component on the electronic board. Since both the solder feeder 114 and the soldering iron 115 are attached to the holding portion 116, a relative positional relationship of these does not change during the rotation of the holding portion 116. Various coupling structures known in the art may be applied to a design of the holding portion 116, the vertically movable column 112 and the driving portion 213. The present embodiment is not limited to a specific coupling structure among the holding portion 116, the vertically movable column 112 and the driving portion 213.

The holding portion 116 includes an arcuate plate 117 to which the soldering iron 115 is attached. An arcuate slot 118 is formed in the arcuate plate 117. The operator may change an attachment position of the soldering iron 115 along the slot 118 to adjust a tilt angle of the soldering iron 115 with respect to an upper surface of the electronic board on the installation table 212. Scale marks (not shown) may be applied along the slot 118. In this case, the operator may visually determine the numerical tilt angle of the soldering iron 115.

A solder bobbin 119, on which the thread solder 213 is wound, is attached to an upper end of the vertically movable column 112. The thread solder 113 extends from the solder bobbin 119 to the solder feeder 114. When soldering is performed, the solder feeder 114 feeds the thread solder 213 to the iron tip (or area near the iron tip) of the soldering iron 115 by an amount set by the operator. Accordingly, the solder is melted at the iron tip (or area near the iron tip) of the soldering iron 115. Various structures for a solder feeding mechanism known in the art may be applied to the solder feeder 114. The present embodiment is not limited to a specific structure of the solder feeder 114.

The support 120 includes a base 121, two columns 122, 123 and a support bridge 124. The base 121 is a portion formed like a substantially rectangular plate. As shown in FIG. 6, a slot 126 extending in the y-axis direction is formed on the upper surface of the base 121. One of the motors of the driving portion 213 may move the installation table 125 along the slot 126. The column 122 stands upward from a left edge of the base 121. The column 123 stands upward from a right edge of the base 121. The columns 122, 123 are aligned in the x-axis direction. The support bridge 124 is bridged from the left column 122 to the right column 123. Therefore, the support bridge 124 extends in the x-axis direction. The soldering mechanism 110 is attached to the support bridge 124. When the operator operates the operation unit 130, one of the motors of the driving portion 213 may move the soldering mechanism 110 along the support bridge 124.

The temperature controller 140 is used for temperature control of the iron tip of the soldering iron 115. Various feedback control techniques known in the art may be applied to the temperature control executed between the temperature controller 140 and the soldering iron 115. The present embodiment is not limited to a specific temperature control technique performed between the temperature controller 140 and the soldering iron 115.

The operation unit 130 includes a housing 131, a left lever 132, a right lever 133 and a storage request portion 134. The operator may tilt (i.e., angularly displace) the left and right levers 132, 133 projecting from an upper surface of the housing 131 to give an instruction to the soldering apparatus 100 so that the soldering apparatus 100 moves the soldering iron 115 and the installation table 212. The storage request portion 134 is used to store the relative positional relationship between the iron tip of the soldering iron 115 and the electric board on the installation table 212. When, during a teaching operation, the iron tip of the soldering iron 115 reaches a desired soldering position on the electronic board, the operator may operate the storage request portion 134, so that a position of the iron tip, in a coordinate space set for arithmetic processes to be executed by the soldering apparatus 100, is stored in the soldering apparatus 100 as a coordinate value of the soldering position. Various electronic components are arranged in the housing 131, the various electronic components being configured to generate electric signals, which indicate tilt amounts of the left and right levers 132, 133, or which indicate that there is an operation on the storage request portion 134.

The operator may tilt the left and right levers 132, 133 to designate a change direction of relative positions between the electronic board on the installation table 125 and the iron tip of the soldering iron 115. With regard to the present embodiment, the left lever 132 is used to move the iron tip of the soldering iron 115 in an extending direction of the z-axis (i.e., upward and downward movement of the iron tip) and to rotate the holding portion 116 (i.e., circular movement of the iron tip of the soldering iron 115 around the rotation axis of the holding portion 116). The right lever 133 is used to move the iron tip of the soldering iron 115 in an extending direction of the x-axis (i.e., leftward and rightward movement of the iron tip) and to move the installation table 125 in an extending direction of the y-axis (i.e., relative forward and rearward movement of the iron tip with respect to the electronic board on the installation table 125). The following table shows a correspondence relationship of the operation of the soldering apparatus 100 with respect to the operation of the left and right levers 132, 133.

TABLE 1

| Operation content | Left lever | Right lever |
| --- | --- | --- |
| Tilt forward | Move iron tip down | Move installation table forward |
| Tilt rearward | Move iron tip up | Move installation table rearward |
| Tilt rightward | Rotate iron tip clockwise | Move iron tip rightward |
| Tilt leftward | Rotate iron tip counterclockwise | Move iron tip leftward |

When the iron tip reaches a soldering position defined on the electronic board on the installation table 125 during the teaching operation, the operator may operate the storage request portion 134 situated between the left and right levers 132, 133 to input the coordinate position of the iron tip in the coordinate space set for arithmetic processes to be executed by the soldering apparatus 100. Accordingly, the soldering apparatus 100 may store an input coordinate position as the soldering position. During a subsequent soldering operation, the soldering apparatus 100 may automatically perform soldering with reference to stored coordinate values of the soldering position. With regard to the present embodiment, the storage request portion 134 is designed as a general pressing button.

The input interface 150 is used to input other operation parameters for operation of the soldering apparatus 100 (e.g., a feeding amount of the aforementioned thread solder 113). With regard to the present embodiment, a touch panel is used as the input interface 150. The input interface 150 may display coordinate values (i.e., soldering positions) input during the aforementioned teaching operation. Therefore, the operator may visually confirm numerical results of the teaching operation. The input interface 150 may be a button keyboard or other means of data entry.

Figure 7A:
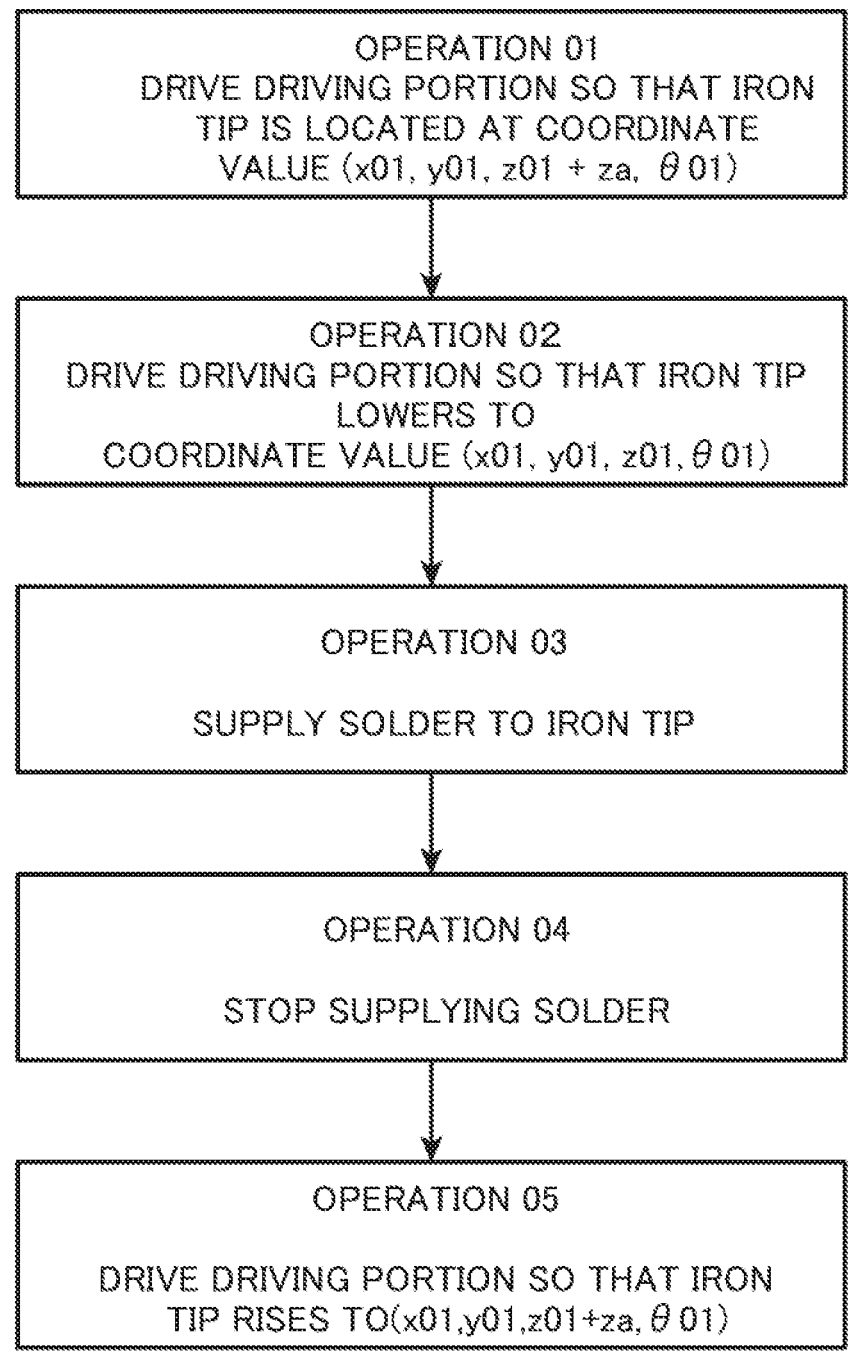
FIG. 7A is flow chart of an example process or algorithm for point soldering.
Figure 7B:
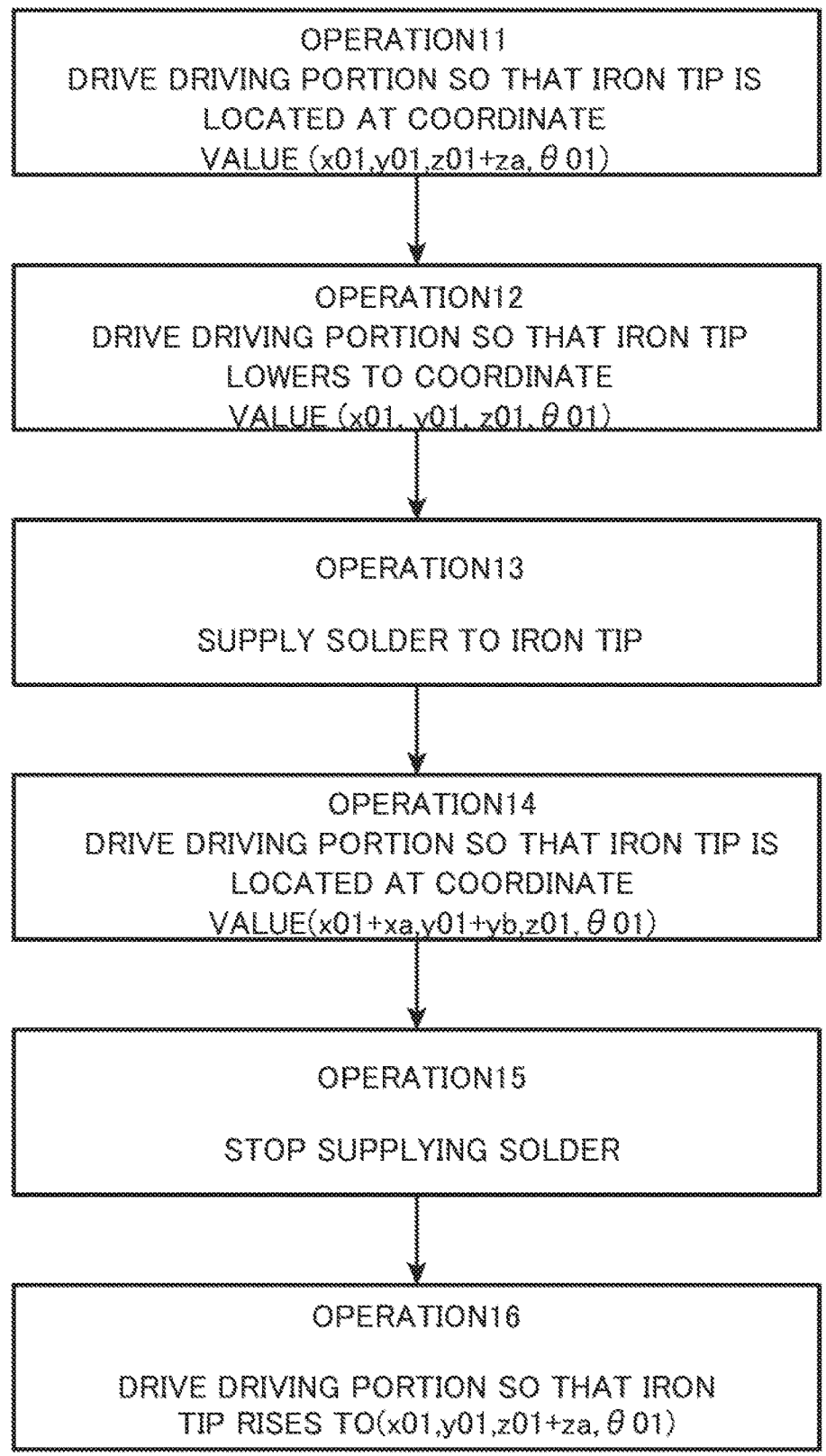
FIG. 7B is flow chart of an example process or algorithm for drag soldering.

FIGS. 7A and 7B are flow charts schematically showing example processes that the soldering apparatus 100 performs after a teaching operation.

After teaching, the soldering apparatus 100 completes a soldering operation at a soldering position that was stored as part of the teaching operation. The soldering operation can be, for example, point solder or drag soldering. FIG. 7A shows a process for point soldering. FIG. 7B shows a process for drag soldering.

The coordinate values shown in FIGS. 7A and 7B correspond to a position in the x-axis direction of the iron tip of the soldering iron 115, a position in the y-axis direction of the iron tip, a position in the z-axis direction of the iron tip, and an angular position of the iron tip around the rotation axis of the holding portion 116. In operation 01 (FIG. 7A) and operation 011 (FIG. 7B), the soldering apparatus 100 uses x-axis coordinate value (x01) and y-axis coordinate value (y01) to move the tip of the soldering iron 115 to the soldering position which was previously stored during the teaching operation. A coordinate value "z01" of the position in the z-axis direction represents a position substantially coincident with the surface of the electronic board. A retreat value "za" represents an amount of upward retreat from the electronic board. A rotation angle "θ01" is set so that the soldering iron 115 does not collide with an electronic component on the electronic board.

In operation 02 (FIG. 7A) and operation 12 (FIG. 7B), the driving portion 180 moves the soldering iron 115 down from position "z01+za" to position "z01". In operation 03 and operation 13, the solder feeder 114 then feeds the thread solder 113 to the iron tip of the soldering iron 115.

In the point soldering process of FIG. 7A, when a sufficient amount of thread solder 113 has been supplied to the iron tip of the soldering iron 115 at soldering position (x01, y01, z01, θ01), the solder feeder 114 stops feeding the thread solder 113 (operation 04). Next at operation 05, the iron tip moves up to the same position it was previously located at operation 01.

In the drag soldering process of FIG. 7B, operation 14 is performed while solder is being supplied to the iron tip. Operation 14 involves moving the iron tip of the soldering iron 115 to coordinates (x01+xa, y01+yb, z01, θ01) which were previously inputted during the teaching operation. The iron tip moves horizontally from (x01, y01, z01, θ01) to (x01+xa, y01+yb, z01, θ01). During movement of the iron tip, the thread solder 113 continues to be fed to the iron tip so that the solder attaches to the electric board. When the iron tip of the soldering iron 115 reaches (x01+xa, y01+yb, z01, θ01), the solder feeder 114 stops feeding the thread solder 113 (operation 15). Next at operation 16, the iron tip moves up by the retreat amount "za."

After numerous point soldering and/or drag soldering operations, the iron tip of the soldering iron 115 will be deteriorated. Molten solder corrodes the iron tip. In general, drag soldering feeds more solder than point soldering. Thus, corrosion may be severe even if there the soldering operation count appears relatively low.

Degradation of the iron tip leads to soldering defects. The iron tip should be replaced before degradation occurs. The operator may decide the timing of replacement based on his/her subjective experience. If the operator is unskilled, there is a risk that significant degradation of the iron tip will occur before the operator decides to inspect or replace. If the operator replaces the tip according to the number of soldering operations, the aforementioned risk decreases. However, this approach requires a lot of record keeping. For example, the operator would have to record the number of electronic boards which were soldered and the number of point soldering or drag soldering operations. Such record keeping is time consuming and prone to human error. These issues are addressed by the functions of the soldering apparatus 100 described below.

<Soldering Apparatus with Indication Function>

Figure 1:
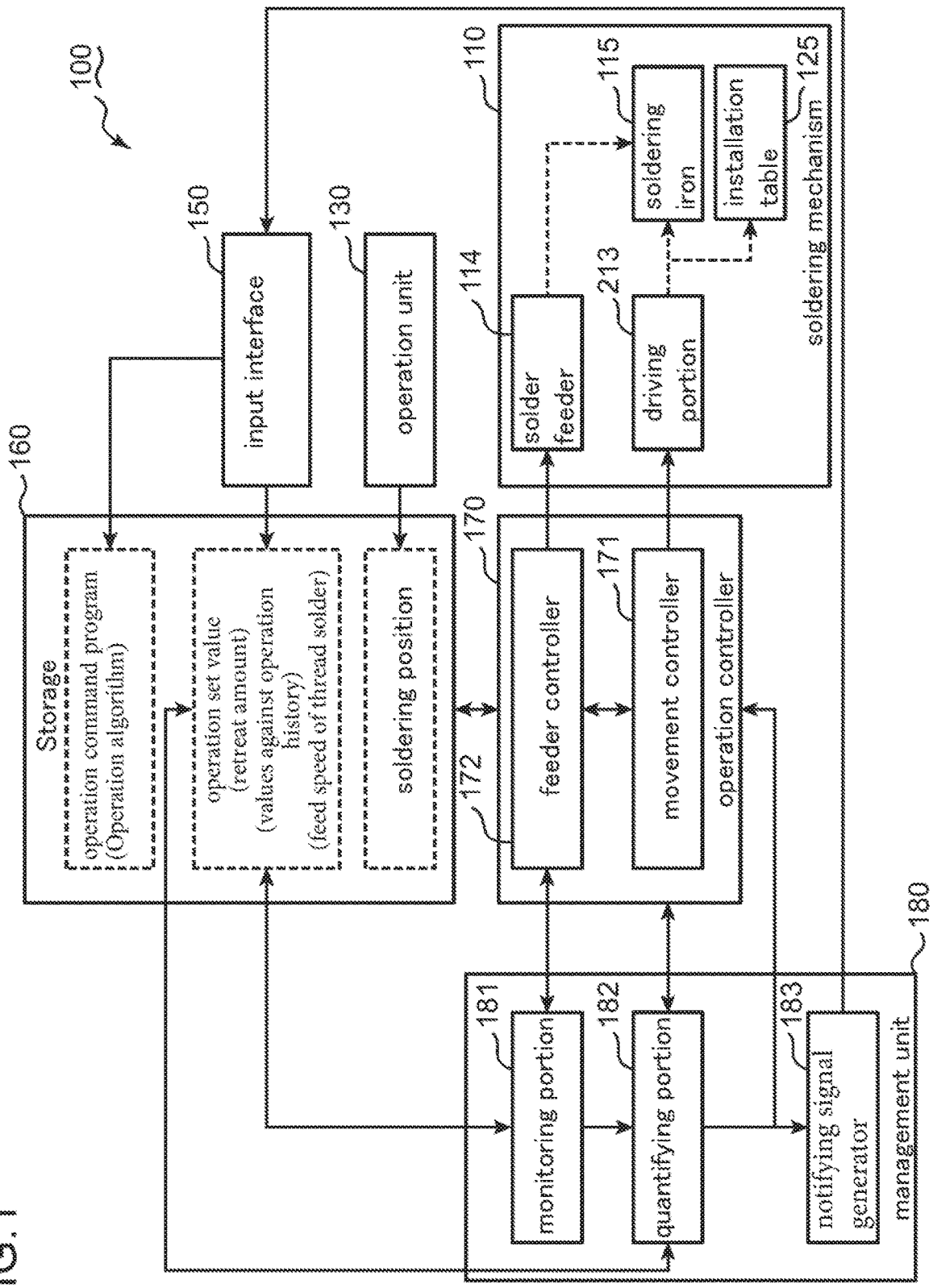
FIG. 1 is a block diagram of functional elements of an example soldering apparatus.

FIG. 1 is a block diagram of an example functional configuration of the soldering apparatus 100.

The soldering apparatus 100 includes storage 160, an operation controller 170 and a management unit 180. Storage 160 stores various input data which are input by an operator (human user) via the operation unit 130 or the input interface 150. The storage 160 can be any or a combination of random-access memory (RAM) modules and read-only memory (ROM) modules. The operation controller 170 controls the solder feeder 114 and the driving portion 213 of the soldering mechanism 110. The management unit 180 manages the operation history of the soldering apparatus 100. If the values of the operation history exceed a predetermined threshold, the operator (human user) is given notice regarding timing of checking the soldering iron tip. The management unit 180 keeps a cumulative count of the number of times each of point soldering operation (FIG. 7A) and drag soldering operation (FIG. 7B) are performed. The management unit 180 keeps track of the operation history in terms of the number of times that the thread solder 113 is fed from the solder feeder 114 to the soldering iron 115 as depicted in Operation 03 of FIG. 7A and Operation 13 of 7B. The management unit 180 may manage operation history as either the time duration of soldering operations or cumulative amount of solder that is fed. The management unit 180 may manage other operations.

The operation controller 170 and the management unit 180 may be in the form of separate computers or may be integrated into a single computer. The operation controller 170 and the management unit 180 may, individually or in combination, comprise one or more computer processors 30 that execute instructions, such as from a software program (e.g., an operation command program), that enable the processes described herein. The instructions may be stored in the storage 160 or other memory device accessible by the soldering apparatus 100. Examples for the storage 160 and other memory device include without limitation a solid-state memory, optical storage (e.g., CD and DVD), and magnetic storage (e.g., HDD).

The storage 160 stores information of the soldering positions and operation set values of the soldering apparatus 100, and the operation command program. Information of the soldering positions and operation set values of the soldering apparatus, and the operation command program are used for operation control of the soldering apparatus 100 and/or management of operation history.

The operator uses operation unit 130 to perform a teaching operation. During the teaching operation, soldering positions (coordinate values) are stored in the storage 160.

During the teaching operation, the operator can input various operation set values via the input interface 150. FIG. 1 shows a retreat amount of the soldering iron 115 from the surface of the electric board, feed speed of thread solder, and values for operation history. These parameters are referred to as operation set values and are used to control the soldering mechanism 110 and/or manage operation history.

The retreat amount of the soldering iron 115 is equivalent to retreat amount "za" in FIGS. 7A and 7B. The operator may input a different retreat amount at every soldering position. In this case, if there is a tall electronic component on the horizontal movement path of the soldering iron 115, the operator may set a large retreat amount to avoid collision with the tall electronic component. In the absence of any tall electronic component on the horizontal movement path, the operator set a small retreat amount. By customizing the retreat amount, overall movement of the soldering iron is minimized, and the soldering operation is performed efficiently (with less time). Alternatively, the operator may input the same retreat amount for all positions as a matter of convenience, thereby allowing the operator to complete the teaching operation in less time.

The feed speed set value of the thread solder 113 is used to feed the thread solder 113 during soldering operation. During soldering operation, the thread solder 113 is supplied to the soldering iron 115 at the speed of feed speed set value. Additionally, the feed speed set value of the thread solder may be used to calculate the cumulative value of thread solder 113 fed from the solder feeder 114 to the soldering iron 115.

As will be described in detail below, the management unit converts the operation history of the soldiering mechanism to a numerical value. The numerical value can be calculated by the management unit from a number of times that an algorithm (for performing a soldering operation) is executed. The numerical value can be calculated by the management unit as a cumulative value of solder thread usage. The management unit compares the numerical value to a threshold value, and soldering by the soldering apparatus 100 is stopped if the numerical value exceeds the threshold. At that time, the management unit 180 notifies the operator to perform an inspection.

The operator operates the input interface 150 to cause the soldering mechanism 100 to perform soldering operations according to the operation command program. The operation command program can include the operation processes depicted in FIG. 7A (point soldering) and FIG. 7B (drag soldering). If the point soldering operation is performed at plural points on the electric board, the operation process of FIG. 7A is performed once at each soldering position that has been programmed into the apparatus 100 during the teaching operation. If the drag soldering operation is operated on the electric board plural times, the operation process of FIG. 7B is performed once at every soldering position that has been programmed into the apparatus 100 during the teaching operation.

The operation controller 170 reads information stored in the storage 160. The operation controller 170 controls the solder feeder 114 and the driving portion 213.

The operation controller 170 includes a movement controller 171 and a feeder controller 172. The movement controller 171 controls the driving portion 213. The feeder controller 172 controls the solder feeder 114.

The movement controller 171 finds the soldering position in the information stored in the storage 160 in response to the operation command program read in the storage 160. The movement controller 171 moves the iron tip of the soldering iron 115 by controlling the driving portion 213. After that, the movement controller 171 operates the soldering mechanism 110 to perform point soldering and/or drag soldering, While the movement controller 171 moves the soldering iron 115, the feeder controller 172 performs "supply solder" (operation 03 in FIG. 7A and operation 13 in FIG. 7B) and "stop supplying solder" (operation 04 in FIG. 7A and operation 15 in FIG. 7B). As a result, point soldering and/or drag soldering is performed on the surface of the electric board.

The management unit 180 includes a monitoring portion 181, a quantifying portion 182 and a notifying signal generator 183. The monitoring portion 181 acquires information for managing a cumulative value of thread solder 113 fed from the solder feeder 114 to the soldering iron 115. The quantifying portion 182 quantifies the operation history of soldering apparatus 100 as the cumulative number of times that a soldering operation process (e.g., FIG. 7A and/or FIG. 7B) is executed and the cumulative amount of the thread solder 113 fed from the solder feeder 114 to the soldering iron 115. The cumulative number of executions and/or the cumulative amount of solder is referred to quantifying information. Based on the quantifying information, the quantifying portion 182 determines whether the check (inspection) timing of soldering iron 115 has been reached. If quantifying portion 182 determines that check timing has been reached, the notifying signal generator 183 creates a notifying signal for notifying the operator that check timing has been reached.

The monitoring portion 181 monitors the control operation of the feeder controller 172 and gets information on the amount of time from when the feeder controller 172 orders feeding the thread solder 113 to the iron tip (operation 03 in FIG. 7A and operation 13 in FIG. 7B) to when order stopping feeding the thread solder (operation 04 in FIG. 7A and operation 15 in FIG. 7B). The amount of time is referred to as "feed period." The monitoring portion 181 reads information which indicates the feed speed of the thread solder from the storage 160. At each soldering position, the monitoring portion 181 multiplies the feed period by feed speed in order to calculate the fed amount of the thread solder. The calculated feed amount at a soldering position is output from the monitoring portion 181 to the quantifying portion 182. The quantifying portion 182 accumulates the feed amounts at various soldering positions and calculates a cumulative value of thread solder 113. The operation history includes the calculated cumulative value of thread solder 113. The quantifying portion 182 compares the calculated cumulative value with a predetermined threshold. If the cumulative value exceeds the threshold, the quantifying portion 182 generates a trigger. As used herein, a trigger is type of data flag or signal. The trigger is transmitted by the quantifying portion 182 to the notifying signal generator 183. In response, the notifying signal generator 183 generates the notifying signal. The notifying signal is transmitted by the notifying signal generator 183 to the input interface 150. In response, a display screen of the input interface 150 displays a message image which prompts the operator to check (inspect) the iron tip of the soldering iron 115. The message image may include any or a combination of text and a picture. Upon seeing the message image on the screen, the operator may check the iron tip. At the same time (when the trigger is generated), the operation controller 170 stops operation of solder feeder 114 and the driving portion 213. As a result, the soldering mechanism 110 stops, in that solder feeder 14 ceases to feed thread solder 113 to the iron tip, and movement of the soldering iron 115 ceases.

The quantifying portion 182 monitors the control movement of the operation controller 170 and counts the number of executions of an algorithm for performing a soldering operation. The quantifying portion 182 quantifies the operation history of the soldering mechanism 110. The quantifying portion 182 compares the number of executions with a predetermined threshold. When the number of executions exceeds the threshold, the quantifying portion 182 creates a trigger. The notifying signal generator 183, the operation controller and the input interface 150 do the same operations as operations in the case of cumulative value of thread solder 113 described in the previous paragraph.

Figure 2:
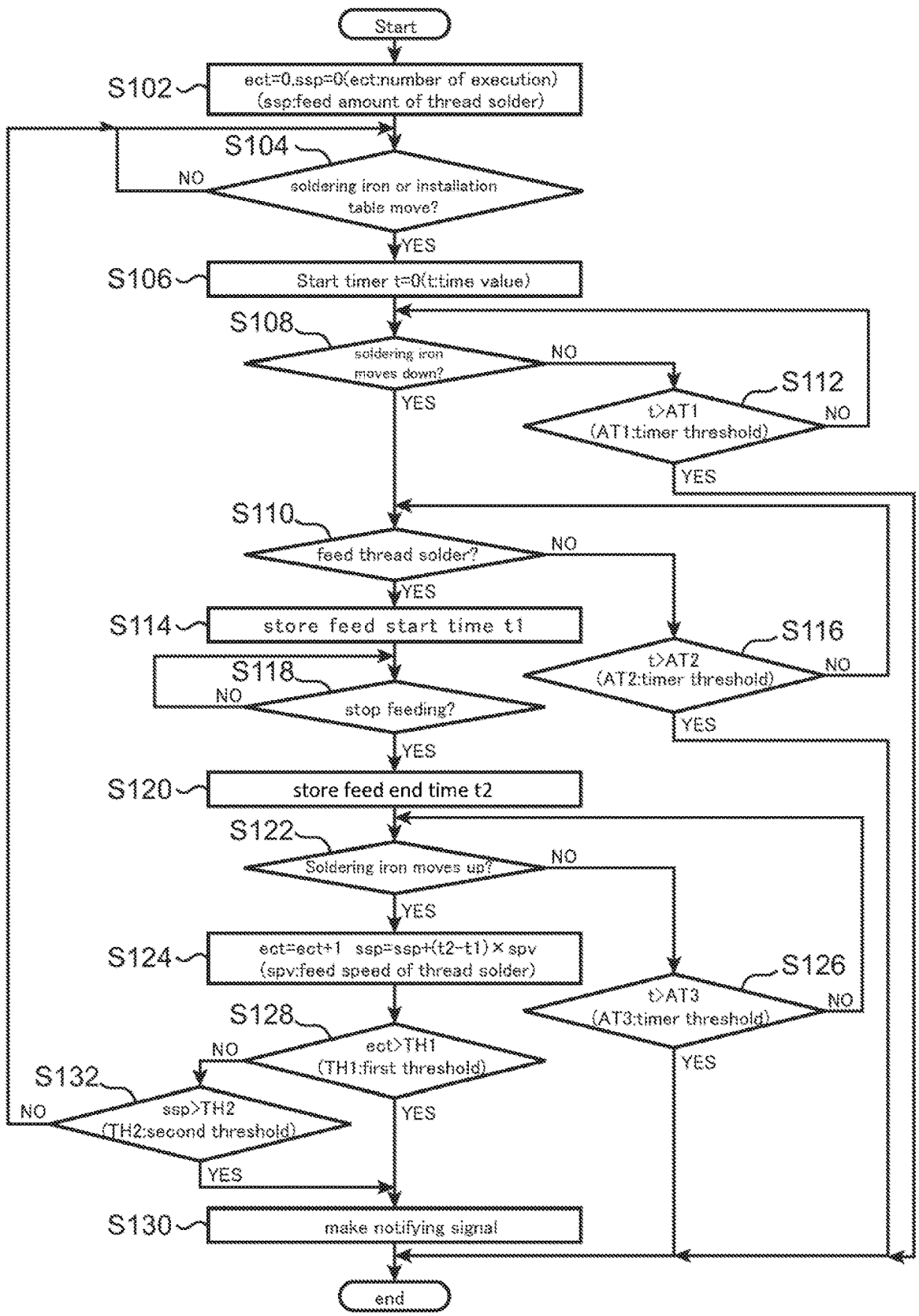
FIG. 2 is a flow chart of an example process for a management unit of the soldering apparatus.

FIG. 2 shows a flow chart of an example process that the management unit 180 performs to manage the operation history.

(Step S102)
The management unit 180 initially sets variable ect=0 and sets variable ssp=0. Variable ect represents the number of soldering process executions. Soldering processes include point soldering and drag soldering. Variable ssp represents the cumulative value of the thread solder 113 usage.

(Step S104)
The quantifying portion 182 monitors for control activity of the movement controller 171 directed to the soldering iron 115 or the installation table 125. The process proceeds to S106 when such control activity is detected by the quantifying portion 182 (when the soldering iron 115 or the installation table 125 moves).

(Step S106)
The monitoring portion 181 and/or the quantifying portion 182 set a timer value t=0. Thereafter, the timer value increases with time. Thereafter, the process proceeds to S108.

(Step S108)
The quantifying portion 182 monitors for control activity of the movement controller 171 and determines whether the soldering iron 115 moves down. The process proceeds to S110 if the detected control activity indicates downward movement of the soldering iron. Otherwise, the process proceeds to S112.

(Step S110)
The monitoring portion 181 and/or the quantifying portion 182 monitors for control activity of the feed controller 172 and determines whether the solder feeder 114 is feeding the thread solder 113 to the soldering iron 115. The process proceeds to S114 if the detected control activity indicates that the thread solder 113 is being fed to the soldering iron 115. Otherwise, the process proceeds to S116.

(Step S112)
The quantifying portion 182 determines whether the timer value "t" exceeds a predetermined timer threshold AT1. The predetermined timer threshold AT1 is value which does not occur when automatic soldering operation is being performed. That is, the condition t>AT1 is not associated with an automatic soldering operation. If t>AT1, a predetermined error process is performed, and the process of the management unit ends. Otherwise (not t>AT1), the process returns to S108.

(Step S114)
The monitoring portion 181 stores feed start time, t1, of the thread solder 113. For example, when the iron moves down (S108: yes) and solder is being fed (S110: yes), the current time value "t" is stored as the feed start time t1. Thereafter, the process proceeds to S118.

(Step S116)
The monitoring portion 181 determines whether the timer value "t" exceeds a predetermined timer threshold AT2, which is greater than AT1. The timer threshold AT2 is value which does not occur when automatic soldering operation is being performed. That is, the condition t>AT2 is not associated with an automatic soldering operation. If t>AT2, a predetermined error process is performed, and the process of the management unit 180 ends. Otherwise, the process returns to S110.

(Step S118)

The monitoring portion 181 monitors for control activity of the feeder controller directed to stopping feed operation of the thread solder 113. If such control activity is detected, the process proceeds to S120.

(Step S120)

The monitoring portion 181 stores the current value of "t" as feed end time t2. Thereafter, the process proceeds to S122.

(Step S122)

The quantifying portion 182 monitors for control activity of the movement controller 171 and determines whether the soldering iron 115 moves up. If such control activity is detected, the process proceeds to S124. Otherwise, the process proceeds to S126.

(Step S124)

The quantifying portion 182 adds "1" to "ect" which represents the cumulative (total) number of times that an algorithm for a soldering process has been executed. For example, the first soldering process may be point soldering. If drag soldering is performed afterwards, then ect=2. The monitoring portion 181 calculates the amount of thread solder 113 which has been used between S114 and S120. The calculation is performed by using feed speed value "spv" which is stored in the storage 160. For example, the amount of time between S114 and S120 may be multiplied by "spy" to obtain a calculated feed amount. The calculated feed amount is transmitted from the monitoring portion 181 to the quantifying portion 182. The quantifying portion 182 adds "ssp" and calculates a cumulative value of the thread solder 113 feed amount. That is, the quantifying portion 182 adds the calculated feed amount to "ssp," which represents the cumulative value of the thread solder 113 feed amount. Thereafter, the process proceeds to S128.

(step S126)

The monitoring portion 181 determines whether the timer value "t" exceeds a predetermined timer threshold AT3. The timer threshold AT3 is value which does not occur when automatic soldering operation is being performed. That is, the condition t>AT3 is not associated with an automatic soldering operation. If t>AT3, a predetermined error process is performed, and the process of the management unit 180 ends. Otherwise, the process returns to S122.

(Step S128)

The quantifying portion 182 reads a predetermined first threshold, TH1, stored in the storage 160. The quantifying portion 182 compares the current value of variable "ect" with "TH1". If ect>TH1, the process proceeds to S130. Otherwise, the process proceeds to S132.

(Step S130)

If ect>TH1, the quantifying portion 182 creates a trigger. The trigger is output from the quantifying portion 182 to the operation controller 170. The notifying signal generator 183 creates notifying signal in response to the trigger. The operation controller 170 stops the soldering mechanism 110 in response to the trigger. The notifying signal is output to the input interface 150. In response to the notifying signal, the input interface displays the message which prompts the user to check the iron tip of the soldering iron 115.

(Step S132)

The quantifying portion 182 reads a second predetermined threshold, TH2, stored in the storage 160. The quantifying portion 182 compares the current value of variable "ssp" with "TH2". If ssp>TH2, the process proceeds to S130. Otherwise, the process returns to S104.

If either ect>TH1 or ssp>TH2, the message image which prompts the user (operator) to check the iron tip of the soldering iron 115 is displayed on the input interface. This reminds the operator that he/she should check the tip. If either ect>TH1 or ssp>TH2, the operation controller 170 stops the soldering mechanism 110 (stops movement of the soldering iron) so that the operator can check the tip and/or other parts of the soldering mechanism 100 without having to manually stop operation of the soldering mechanism 110. If necessary, the operator can replace parts of the soldering mechanism 110 which should be replaced to keep the soldering mechanism 110 in good working order.

Alternatively or additionally, the input interface 150 may make an alarm sound in response to the notifying signal from the notifying signal generator 183.

Alternatively or additionally, the notifying signal generator 183 may output the notifying signal to an external device. The external device may output the display or sound which prompts the operator to check the soldering iron 115.

<Other Features>

Various other features can be provided to the soldering apparatus 100.

(Restart of Soldering)

The input interface 150 may accept reset of operation history. The operator operates the input interface 150 in order to reset of operation history. In response, the management unit 180 sets ect=0 and/or sets ssp=0.

Reset information can be transmitted not only to the management unit 180 but also to the operation controller 170. The operation controller 170 restarts soldering in response to the reset information. As used herein, "reset information" may be a data flag or command signal. As discussed below, reset information is generated upon operator (user) input to resume (restart) soldering operations after the soldering mechanism 100 has been stopped for inspection.

Figure 3:
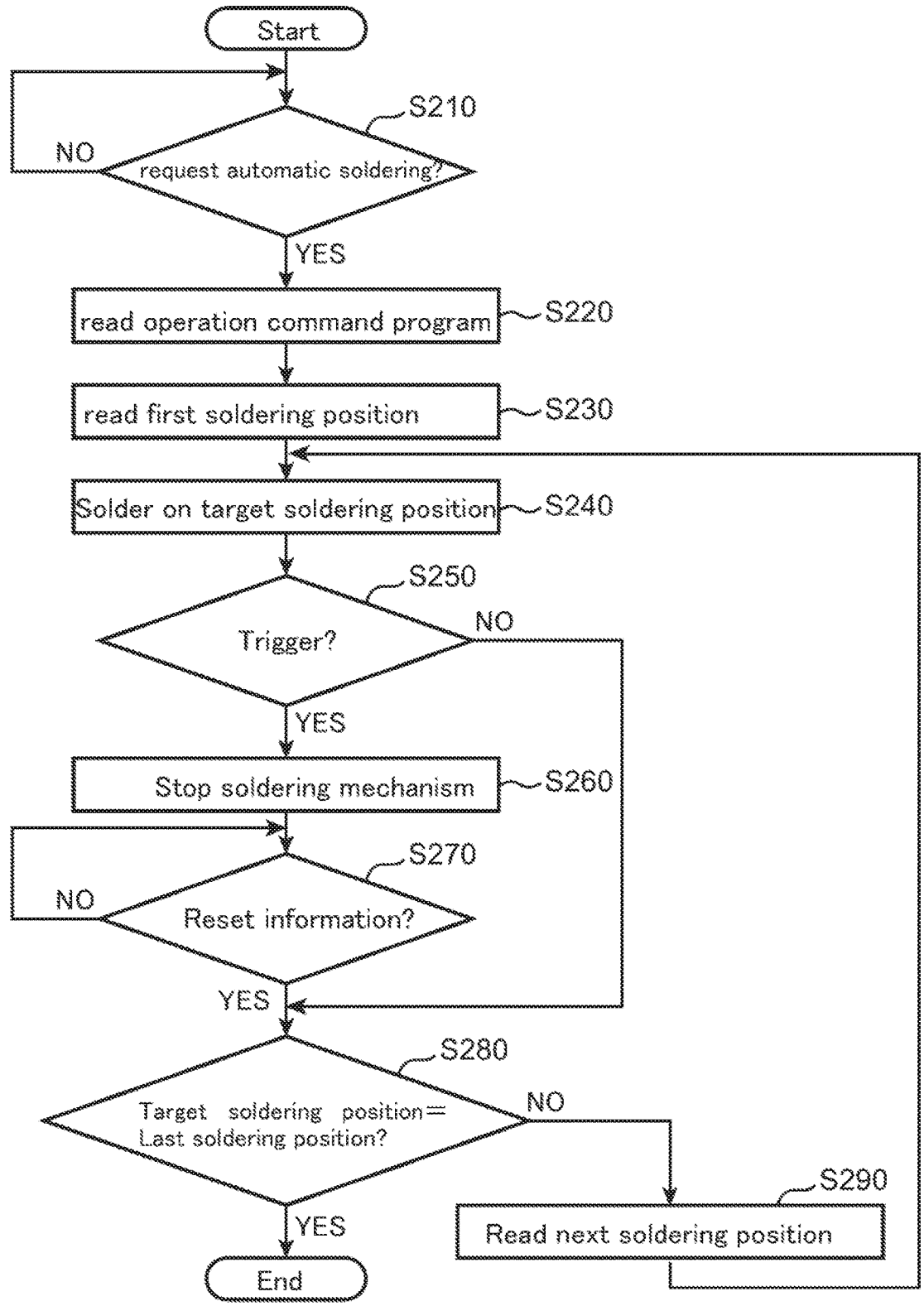
FIG. 3 is flow chart of an example process for an operation controller of the soldering apparatus.

FIG. 3 shows a flow chart of an example process for the operation controller 170 which has restart functions.

(Step S210)

The operation controller 170 monitors the input interface 150 for an operator request to start automatic soldering. Before the request to start automatic soldering, the operator has used the operation unit 130 to store soldering positions and used the input interface 150 to create an operation command program, which is stored the storage 160. The operator operates the input interface to request performance of automatic soldering. If the operation controller 170 detects such a request, the process proceeds to S220.

(Step S220)

The operation controller 170 reads the operation command program stored in the storage 160. Thereafter, the process proceeds to S230.

(Step S230)

The operation controller 170 reads the first soldering position in response to the operation command program. Thereafter, the process proceeds to S240.

(Step S240)

The operation controller 170 executes an algorithm that causes the soldering mechanism 110 to perform a soldering operation on a target soldering position. Point or drag solder is performed on the target soldering position. Thereafter, the process proceeds to S250.

(Step S250)

The operation controller 170 determines whether it receives the trigger or not. Again, the trigger is generated if either ect>TH1 or ssp>TH2. If the trigger is output from the management unit 180 to operation controller 170, the process proceeds to S260. Otherwise, the process proceeds to S280.

(Step S260)

If it receives the trigger, the operation controller 170 stops the soldering mechanism 110 at a retreat position where the iron tip is away from the surface of the electric board. While movement of the soldering mechanism 110 is stopped, the operator can check the iron tip or other parts. Thereafter, the process proceeds to S270.

(Step S270)

After the soldering mechanism 110 is stopped, the operation controller 170 waits to receive reset information. When the operator finishes checking the soldering mechanism 110 or replacing a part, he/she operates the input interface 150 to request restart of soldering. Reset information, which represents the operator requests to restart soldering, is output from the input interface to the operation controller 170. Thereafter, the process proceeds to S280.

(Step S280)

The operation controller 170 determines whether the current target soldering position is the last soldering position or not. If all soldering operation are finished, the process ends. If there is a soldering position that remains to be soldered, the process proceeds to S290.

(Step S290)

The operation controller 170 reads the next soldering position in response to the operation command program. Thereafter, the process proceeds to S240. Even if the soldering operation is interrupted (due to a need to inspect the iron tip or other parts), it is possible to restart soldering. In this way, the electronic board (carried on the installation table 212) is not discarded but is completed.

If the soldering operation is interrupted on one electronic board and the soldering operation is interrupted, teaching for new electronic board may be required. However, restart function makes it possible to continue soldering operation after interruption. This reduces the burden of teaching.

(Temperature Control)

The temperature controller 140 may change the target temperature of the iron tip in response to the stop or restart of the soldering mechanism 110. When the soldering mechanism 100 is stopped, tip temperature decrease automatically, which allows the operator to check the iron tip safely without having to manually reduce the temperature. Besides this, melting of the thread solder 113 is prevented while the operator checks.

Figure 4:
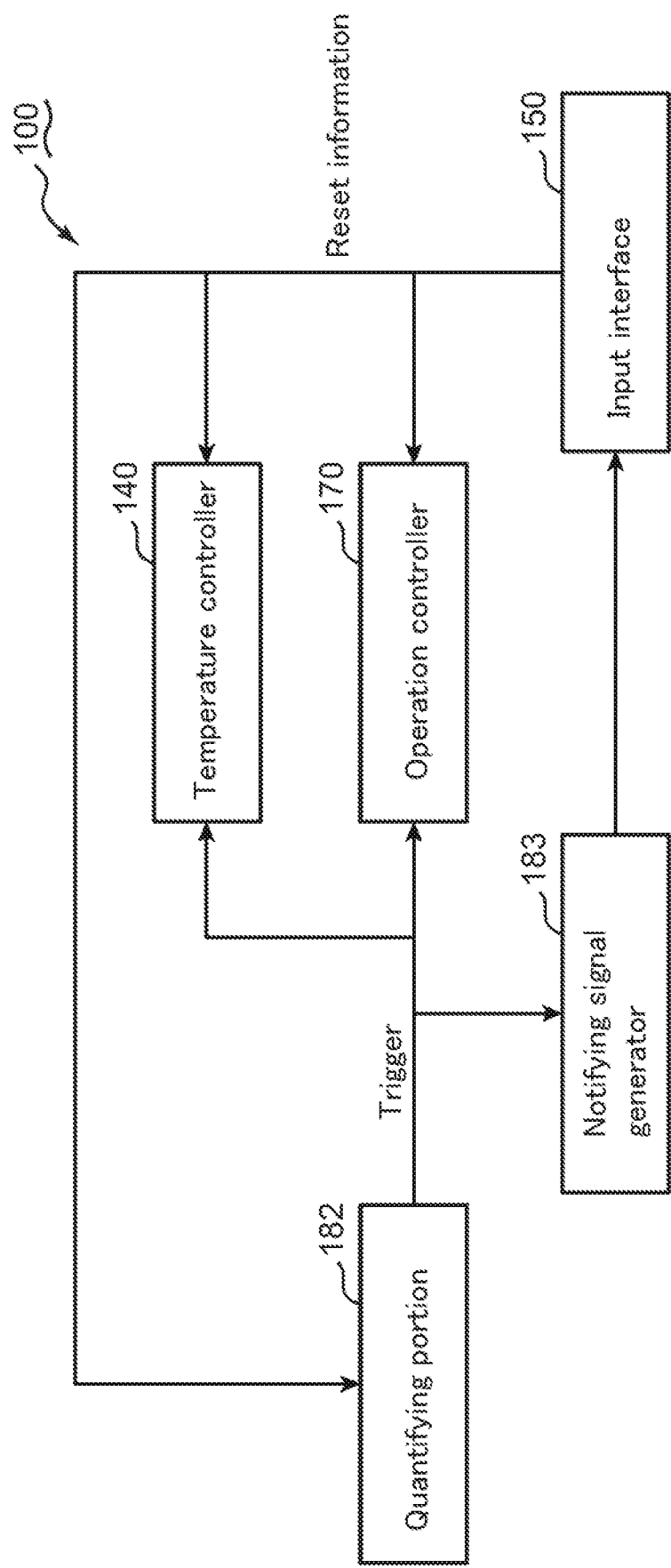
FIG. 4 is block diagram of showing example relationships among the functional elements of the soldering apparatus.

FIG. 4 is a block diagram of soldering apparatus 100. FIG. 4 shows the relationship of the temperature controller 140, the input interface 150, the operation controller 170, the quantifying portion 182 and the notifying signal generator 183.

At S130 in FIG. 2, when the operation history exceeds the threshold, the trigger is output from the quantifying portion 182 to the operation controller 170 and the notifying signal generator 183. The trigger is output to the temperature controller 140. The temperature controller 140 sets the target temperature for the iron tip from the first temperature to the second temperature which is lower than first temperature in response to the trigger signal. The first temperature is a temperature which is higher than the melting point of the thread solder 113. The second temperature is a temperature which is lower than the melting point of the thread solder 113. The lowering of the target temperature begins almost at the same time as the stopping of the soldering mechanism 110. In this context, "almost at the same time" encompasses at the same time as stopping of the soldering mechanism 110 and within 2 seconds (before or after) of stopping of the soldering mechanism 110. Consequently, the temperature of the iron tip is kept low while the soldering mechanism 110 is stopped. This prevents melting of the thread solder 113.

At S270 in FIG. 3, when the operator operates the input interface 150 to request restart of soldering, the reset information is output from the input interface 150 to the quantifying portion 182. In response, the quantifying portion 182 sets ect=0 and sets ssp=0. The operation controller 170 restarts control the soldering mechanism 110. As FIG. 4 shows, the reset information is output to not only the quantifying portion but also the operation controller and temperature controller. The temperature controller changes the target temperature from the second temperature to the first temperature. The iron tip heats up in response to the restart of the soldering mechanism 110.

The temperature controller 140 may notify that the tip temperature reaches a temperature sufficient to melt the thread solder 113 in order that the soldering mechanism 110 restarts after iron tip reaches the temperature sufficient to melt the thread solder 113. The operation controller 170 can restart control the soldering mechanism 110 in response to the notifying from the temperature controller 140.

Figure 5:
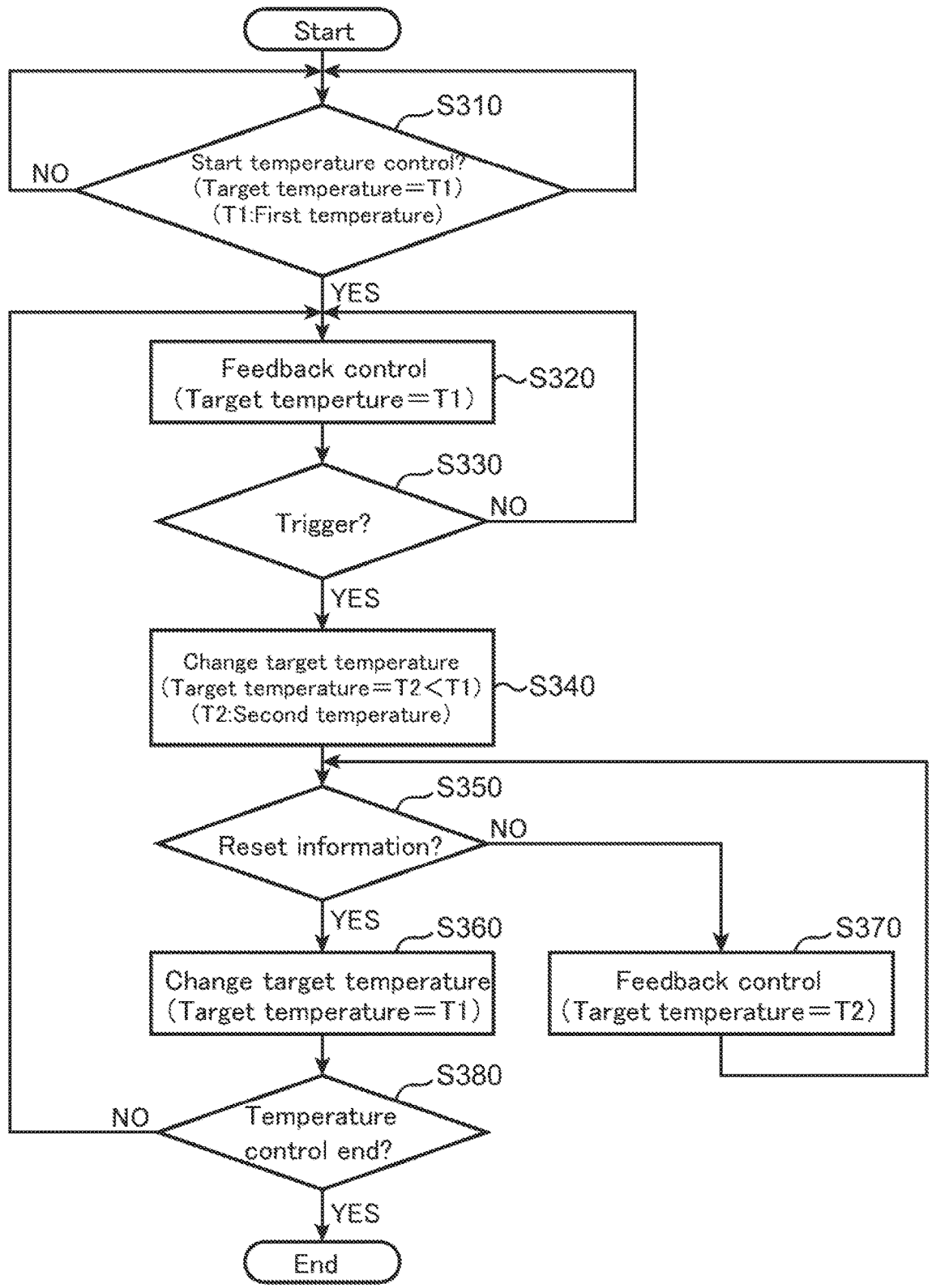
FIG. 5 is flow chart of an example process for a temperature controller of the soldering apparatus.

FIG. 5 is a flowchart of an example process for the temperature controller 140 which changes the target temperature in response to the stop or restart of the soldering mechanism 110.

(Step S310)

The temperature controller 140 waits for the operator to request commencement of temperature control. The operator operates the temperature controller 140 and sets the target temperature to the first temperature T1. T1 is a temperature sufficient to melt the thread solder 113. After that, the operator operates the temperature controller 140 to requests commencement of temperature control. Thereafter, the process proceeds to S320.

(Step S320)

The temperature 140 performs feedback control to bring the iron tip to the target temperature T1. With feedback control, the temperature of the iron tip can be kept within a predetermined temperature range. The predetermined temperature range can contain T1. Thereafter, the process proceeds to S330.

(Step S330)

The temperature controller 140 determines whether it receives the trigger from the quantifying portion 182 or not. If the trigger is received, the process proceeds to S340 and the soldering mechanism 110 stops. Otherwise, the process returns to S320.

(Step S340)

If the trigger is received, the temperature controller 140 changes the target temperature of the iron tip from T1 to T2. T2 is lower than T1. T2 may be lower than the melting point of the thread solder 113 so that the thread solder 113 is not melted while the soldering mechanism 110 is stopped. Thereafter, the process proceeds to S350.

(Step S350)

The temperature controller 140 determines whether it receives reset information from the input information 150. If the reset information is received, the process proceeds to S360 and the soldering mechanism 110 restarts. Otherwise, the process proceeds to S370.

(Step S360)

If reset information is received, the temperature controller 140 changes the target temperature from T2 to T1. Thereafter, the process proceeds to S380.

(Step S370)

If reset information is not received, the temperature controller 140 performs feedback control to keep the iron tip at the target temperature T2. With feedback control, the iron tip can be kept within a predetermined temperature range. The predetermined temperature range can contain T2. Thereafter, the process proceeds to S350.

(Step S380)

If the operator performs an operation which stops the heat control for the iron tip, the temperature controller 14 stops. Otherwise, the process returns to S320.

As described above, the temperature controller 140 changes the target temperature in response to the trigger from the quantifying portion 140 and in response to reset information from the input interface 150. Alternatively or additionally, the temperature controller 140 may stop supplying power to the soldering iron in response to the trigger from the quantifying portion 140 and resume supplying power to the soldering iron in response to reset information from the input interface 150.

As a result of the temperature control in FIG. 5, tip temperature of the soldering iron 115 gets lower when the soldering mechanism 110 stops. The operator can check the iron tip or other parts of the soldering mechanism 110 (i.e., perform an inspection operation) safely without having to manually operate the temperature controller 140 in order to lower temperature. Thus, even when the operator does not operate the temperature controller 140, melting of the tip of the thread solder 113 located near the iron tip of the soldering iron 115 is prevented during the inspection operation.

As described above, when the operation history of the soldering mechanism 110 exceeds a predetermined threshold value, the operation of the soldering mechanism 110 is stopped. However, the operator who received the notification information (message image or notification sound prompting check of the tip of the soldering iron 115) output according to the notification signal may stop the soldering mechanism 110 manually.

The notifying function described above is mainly used to notify the operator of check (inspection) timing of the iron tip of the soldering iron 115. However, the notification function may be used to notify the operator of the check timing of another part (e.g., the driving motor) of the soldering mechanism 110.

As described above, the display unit of the input interface 150 (that is, the screen of the touch panel) displays a message image prompting the operator to check the iron tip. However, the display unit of the input interface 150 may display a message image prompting the operator to replace the iron tip. The principle of the above embodiment is not limited to a specific image displayed by the display unit of the input interface 150 in response to a notification signal.

The soldering position is set by operation of the operation unit 130 by the operator. However, the soldering position may be set by operation on the input interface 150 by the operator. The principle of the above embodiment is not limited to a specific operation for determining the soldering position.

The notification function described above may be incorporated into a general automatic soldering apparatus. Therefore, the principle of the above-described embodiment is not limited to the specific structure of the soldering apparatus 100.

What is claimed is:

1. A soldering apparatus comprising:
   a soldering mechanism configured to move a soldering iron to a soldering position on an electronic board and configured to supply solder to the soldering iron at the soldering position; and
   a management unit configured to manage operation history of the soldering mechanism, the management unit comprising a quantifying portion that converts the operation history of the soldering mechanism into a numerical value and that compares the numerical value to a predetermined threshold value, the management unit further comprising a notifying signal generator that generates a notifying signal in response to a determination by the quantifying portion that the numerical value exceeds the predetermined threshold value.

2. The soldering apparatus of claim 1, further comprising:
   an operation controller that controls operation of the soldering mechanism,
   wherein, in response to the notifying signal generated by the notifying signal generator, the operation controller stops operation of the soldering mechanism.

3. The soldering apparatus of claim 2, further comprising:
   an input interface that receives, from an operator, a request for resetting the operation history,
   wherein, in response to the notifying signal generated by the notifying signal generator, the operation controller stops operation of the soldering mechanism after soldering is performed on a first soldering position but before soldering is performed on a second soldering position, and
   wherein, in response to the received request for resetting, the operation controller controls the soldering mechanism so that soldering is performed on the second soldering position.

4. The soldering apparatus of claim 2, further comprising:
   an input interface that receives, from an operator, input of the predetermined threshold value.

5. The soldering apparatus of claim 4, wherein the input interface comprises a display unit that, in response to the notifying signal generated by the notifying signal generator, displays an image that prompts the operator to check or replace a tip of the soldering iron.

6. The soldering apparatus of claim 2, wherein:
   the operation controller is configured to execute an algorithm one or more times, the algorithm causing the soldering mechanism to perform soldering at a soldering position from among a plurality of soldering positions,
   the quantifying portion calculates the numerical value by counting a number of times that the algorithm is executed,
   the quantifying portion compares the number of times to the predetermined threshold value, and
   the notifying signal generator generates the notifying signal in response to a determination by the quantifying portion that the number of times exceeds the predetermined threshold value.

7. The soldering apparatus of claim 2, wherein:
   the soldering mechanism comprises a solder feeder,
   the operation controller controls the solder feeder to supply the solder to the soldering iron,
   the management unit comprises a monitoring portion that monitors a feed amount of the solder supplied by the solder feeder to the soldering iron,
   the quantifying portion calculates the numerical value as a cumulative value of the feed amount that is monitored by the monitoring portion,
   the quantifying portion compares the cumulative value to the predetermined threshold value, and the notifying signal generator generates the notifying signal in response to a determination by the quantifying portion that the cumulative value exceeds the predetermined threshold value.

8. The soldering apparatus of claim 2, wherein:

the operation controller is configured to execute an algorithm one or more times, the algorithm causing the soldering mechanism to perform soldering at a soldering position from among a plurality of soldering positions, the soldering mechanism comprises a solder feeder, the operation controller controls the solder feeder to supply the solder to the soldering iron, the management unit comprises a monitoring portion that monitors a feed amount of the solder supplied by the solder feeder to the soldering iron, the quantifying portion calculates the numerical value by counting a number of times that the algorithm is executed, and compares the number of times to the predetermined threshold value, the quantifying portion calculates a second numerical value as a cumulative value of the feed amount that is monitored by the monitoring portion, and compares the cumulative value to a second predetermined threshold value, and the operation control unit stops the soldering mechanism in response to a determination by the quantifying portion that either the number of times that the algorithm is executed exceeds the predetermined threshold value or the cumulative value exceeds the second predetermined threshold value.

9. The soldering apparatus of claim 1, further comprising:

a temperature controller configured to control temperature of the soldering iron, wherein, in response to the notifying signal generated by the notifying signal generator, the temperature controller lowers the temperature of the soldering iron.

10. The soldering apparatus of claim 3, further comprising:

a temperature controller configured to control temperature of the soldering iron, wherein, in response to the notifying signal generated by the notifying signal generator, the temperature controller lowers the temperature of the soldering iron from T1 to T2, and wherein, after lowering the temperature of the soldering iron to T2 and in response to the received request for resetting, the temperature controller increases the temperature of the soldering iron to T1.

* * * * *